US012217704B2

(12) United States Patent
Baek

(10) Patent No.: US 12,217,704 B2
(45) Date of Patent: Feb. 4, 2025

(54) ORGANIC LIGHT EMITTING DISPLAY DEVICE

(71) Applicant: LG Display Co., Ltd., Seoul (KR)

(72) Inventor: Heum Il Baek, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/973,283

(22) Filed: Oct. 25, 2022

(65) Prior Publication Data

US 2023/0215385 A1    Jul. 6, 2023

(30) Foreign Application Priority Data

Dec. 30, 2021 (KR) ........................ 10-2021-0193176

(51) Int. Cl.

| G09G 3/3291 | (2016.01) |
| G09G 3/3266 | (2016.01) |
| H01L 27/12 | (2006.01) |
| H10K 50/15 | (2023.01) |
| H10K 50/16 | (2023.01) |
| H10K 50/17 | (2023.01) |
| H10K 59/121 | (2023.01) |
| H10K 59/131 | (2023.01) |
| H10K 59/35 | (2023.01) |

(52) U.S. Cl.
CPC ......... *G09G 3/3291* (2013.01); *G09G 3/3266* (2013.01); *H01L 27/124* (2013.01); *H01L 27/1255* (2013.01); *H10K 50/15* (2023.02); *H10K 50/16* (2023.02); *H10K 50/17* (2023.02); *H10K 59/1213* (2023.02); *H10K 59/1216* (2023.02); *H10K 59/131* (2023.02); *H10K 59/353* (2023.02)

(58) Field of Classification Search
CPC .. G09G 3/3258; G09G 3/2003; G09G 3/3233; G09G 2300/0842; G09G 2310/08; G09G 2300/0809; G09G 2320/0666; G09G 2320/043; G09G 2320/0242; G09G 2330/08; G09G 2300/0452
See application file for complete search history.

(56) References Cited

U.S. PATENT DOCUMENTS

| 2008/0111777 | A1* | 5/2008 | Kim ..................... G09G 3/3233 345/83 |
| 2009/0045751 | A1* | 2/2009 | Peng ..................... H10K 59/128 315/169.2 |
| 2010/0019656 | A1* | 1/2010 | Yu ........................ H10K 59/38 445/24 |
| 2011/0074838 | A1* | 3/2011 | Yamamoto ........... G09G 3/3233 345/76 |
| 2011/0210316 | A1* | 9/2011 | Kadoma ............ H10K 85/6574 257/E51.024 |

(Continued)

*Primary Examiner* — Shaheda A Abdin
(74) *Attorney, Agent, or Firm* — Birch, Stewart, Kolasch & Birch, LLP

(57) ABSTRACT

Discussed is an organic light emitting display device capable of achieving an enhancement in blue characteristics while having subpixels having a same size by designing a blue one of the subpixels using a hole only device (HOD) structure. The blue subpixel can include two blue emission material layers stacked to form the HOD structure. The blue subpixel can driven using two data lines and two driving transistors so that the two blue emission material layers alternately emit light on a frame basis.

19 Claims, 7 Drawing Sheets

(56) References Cited

U.S. PATENT DOCUMENTS

| | | | |
|---|---|---|---|
| 2015/0332628 A1* | 11/2015 | Ren | G09G 3/3258 |
| | | | 345/83 |
| 2016/0275870 A1* | 9/2016 | Kimura | G09G 3/3258 |
| 2020/0212130 A1* | 7/2020 | Kim | H10K 50/818 |
| 2020/0274087 A1* | 8/2020 | Lee | H10K 50/171 |

* cited by examiner

ORGANIC LIGHT EMITTING DISPLAY DEVICE

CROSS-REFERENCE TO RELATED APPLICATIONS

This application claims priority to Korean Patent Application No. 10-2021-0193176 filed in the Republic of Korea on Dec. 30, 2021, the entire contents of which are hereby expressly incorporated by reference into the present application.

BACKGROUND OF THE INVENTION

Field of the Invention

The present invention relates to an organic light emitting display device using a hole only device (HOD) structure.

Discussion of the Related Art

Various technologies associated with a display device for displaying visual information in the form of an image or a picture are being developed in our information-dependent society.

Among various display devices, an organic light emitting display device is being highlighted as the next-generation display in that the organic light emitting display device uses an organic light emitting diode (OLED), which is a self-luminous element configured to emit light from a light emission material layer thereof through re-combination of an electron and a hole. As a result, the organic light emitting display device is capable of not only having characteristics such as rapid response time, high luminance, low driving voltage, and ultra-thinness, but also being implemented to have various shapes.

However, when the unit pixel of such an organic light emitting display device is constituted by a red subpixel including an OLED configured to emit red, a green subpixel including an OLED configured to emit green, and a blue subpixel including an OLED configured to emit blue, there can be a limitation in peak luminance.

Furthermore, the blue OLED exhibits a relatively low efficiency and a relatively short lifespan. To this end, the blue subpixel has been designed to have a relatively large size in order to enhance blue characteristics.

SUMMARY OF THE INVENTION

Accordingly, the present disclosure is directed to an organic light emitting display device that substantially obviates one or more problems due to limitations and disadvantages of the related art.

An object of the present invention is to provide an organic light emitting display device capable of achieving an enhancement in blue characteristics while having subpixels having the same size by designing a blue one of the subpixels using a hole only device (HOD) structure.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, an organic light emitting display device includes an organic light emitting display device includes a display panel including a plurality of data lines and a plurality of scan lines intersecting each other, and unit pixels disposed in the form of a matrix such that each of the unit pixels is disposed in a region where one scan line intersects four data lines, wherein each of the unit pixels includes at least three subpixels, and wherein one of the at least three subpixels included in the unit pixel includes two emission material layers stacked to form a hole only device (HOD) structure.

The one subpixel can be driven by two driving transistors.

The one subpixel can be driven by two data lines.

The one subpixel further includes a first electrode and a second electrode, and a first hole injection layer, a first hole transport layer, a first one of the emission material layers, a first electron transfer layer, a charge generation layer, a second electron transfer layer, a second one of the emission material layers, a second hole transport layer and a second hole injection layer can be sequentially stacked in this order between the first electrode and the second electrode.

The first hole injection layer, the first hole transport layer, the first emission material layer, the first electron transfer layer, the charge generation layer, the second electron transfer layer, the second emission material layer, the second hole transport layer and the second hole injection layer can be formed by an inkjet printing process.

Each of the first and second emission material layers can include a blue emission material layer.

Only the first emission material layer can emit light when a positive (+) voltage is applied to the first electrode, and a negative (−) voltage is applied to the second electrode. Only the second emission material layer can emit light when the negative (−) voltage is applied to the first electrode, and the positive (+) voltage is applied to the second electrode.

The one subpixel can be driven by one scan line and first and second data lines. The one subpixel can include a first switching transistor including a gate electrode connected to the scan line, a first electrode connected to the first data line and a second electrode connected to a first node, thereby being controlled by a scan pulse of the scan line, to transmit a data voltage of the first data line to the first node, a first driving transistor including a gate electrode connected to the first node, a first electrode connected to a first high-level voltage supply line and a second electrode connected to a second node, thereby controlling current flowing through a first organic light emitting element in accordance with a voltage of the first node, a first capacitor connected between the first node and the second node, to store a data voltage supplied to the first node for one frame, a second switching transistor including a gate electrode connected to the scan line, a first electrode connected to the second data line and a second electrode connected to a third node, thereby being controlled by the scan pulse of the scan line, to transmit a data voltage of the second data line to the third node, a second driving transistor including a gate electrode connected to the third node, a first electrode connected to a second high-level voltage supply line and a second electrode connected to the second node, thereby controlling current flowing through a second organic light emitting element in accordance with a voltage of the third node, and a second capacitor connected between the third node and the second high-voltage supply line, to store a data voltage supplied to the third node for one frame. The first and second organic light emitting elements are reversely connected to each other between the second node and a low-level voltage supply line.

A data voltage can be alternately applied to the first and second data lines on a frame basis.

The first high-level voltage supply line can apply a positive (+) high-level voltage, and the second high-level voltage supply line can apply a negative (−) high-level voltage.

Each of the first and second organic light emitting elements can include a blue light emitting diode.

In the organic light emitting display device having the above-described features according to the example embodiments of the present invention, there are effects as follows.

First, the blue subpixel is formed to have an HOD structure in which first and second blue emission material layers are symmetrical with each other with reference to a charge generation layer and is driven by two driving transistors such that one of the first and second blue emission material layers emits light in accordance with polarities of voltages applied to first and second electrodes.

Accordingly, a first blue light emitting element and a second blue light emitting element of the blue subpixel can be alternately driven on a frame basis and, as such, it can be possible to double the lifespan of the blue subpixel.

Second, even when the blue subpixel has the same size as the red subpixel or the green subpixel, blue emission characteristics can be enhanced.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EMBODIMENTS

Figure 1:
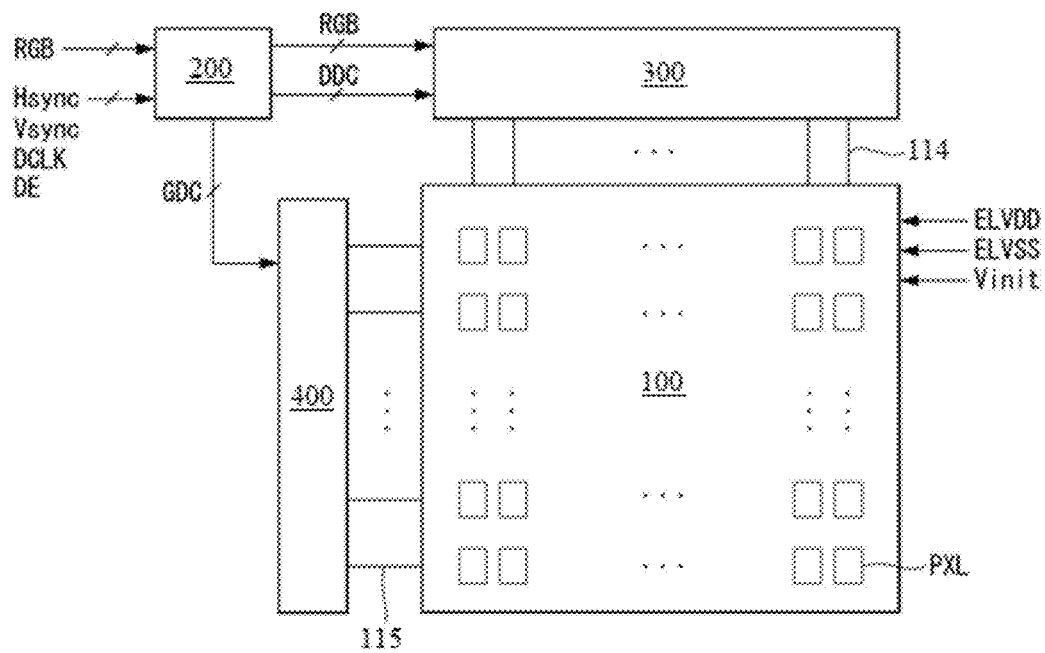
FIG. 1 shows an organic light emitting display device according to an example embodiment of the present invention.

Hereinafter, a pixel circuit according to an example embodiment of the present invention and an organic light emitting display device including the same, which have the above-described features, will be described in detail with reference to the accompanying drawings. Throughout the specification, the same reference numerals designate substantially the same constituent elements.

Although a device, which will be described hereinafter, will be described in conjunction with an example in which the device includes an n-type thin film transistor (TFT), the device can be implemented to include a p-type TFT or a TFT having a type in which both the n type and the p type are present. The TFT can be a triple-electrode element including a gate, a source and a drain. The source is an electrode configured to supply a carrier to the transistor. The carrier in the TFT first flows from the source. The drain is an electrode from which the carrier is discharged from the TFT to an exterior of the TFT. That is, the carrier in the TFT flows from the source to the drain.

In the case of an n-type TFT, a source voltage has a lower level than a drain voltage such that an electron can flow from a source to a drain because the electron is a carrier. In the n-type TFT, current flows from the drain to the source because the electron flows from the source to the drain. Conversely, in the case of a p-type TFT, a source voltage has a higher level than a drain voltage such that a hole can flow from a source to a drain because the hole is a carrier. In the p-type TFT, current flows from the source to the drain because the hole flows from the source to the drain. In a TFT, however, a source and a drain can be interchanged in accordance with voltages applied thereto. Taking into consideration of such conditions, one of the source and the drain can be referred to as a "first electrode", and the other of the source and the drain can be referred to as a "second electrode". Further, the terms 'invention' and 'disclosure' are interchangeably used.

FIG. 1 shows an organic light emitting display device according to an example embodiment of the present invention. All components of each organic light emitting display apparatus according to all embodiments of the present disclosure are operatively coupled and configured.

Referring to FIG. 1, the organic light emitting display device according to the example embodiment of the present invention includes a display panel 100 formed with one or more pixels (or unit pixels) PXL, a data driving circuit 300 configured to drive data lines 114, a gate driving circuit 400 configured to drive scan lines 115, and a timing controller 200 configured to control driving timings of the data driving circuit 300 and the gate driving circuit 400. The organic light emitting display device according to the example embodiment of the present invention can further include additional structure or elements.

Each subpixel of the display panel 100 includes an organic light emitting diode (hereinafter referred to as an "OLED"), and a pixel circuit configured to independently drive the OLED.

A plurality of data lines 114 and a plurality of scan lines 115 intersect each other at the display panel 100. The unit pixels PXL are disposed in the form of a matrix so that each of the unit pixels PXL is disposed in a region where one scan line 115 intersects four data lines 114. The unit pixels PXL disposed on the same horizontal line constitute one pixel row. The unit pixels PXL disposed in one pixel row are connected to the one scan line 115, and the one scan line 115 can include one or more scan lines and one or more emission lines.

That is, each unit pixel PXL can be connected to four data lines 114, one or more scan lines, and one or more emission lines. The unit pixels PXL can receive, in common, high-level and low-level driving voltages VDD and VSS from a power generator. Details of the configuration of the embodiments will be described later.

TFTs constituting one unit pixel PXL can be implemented as an oxide TFT including an oxide semiconductor layer. The oxide TFT is advantageous in terms of enlargement of the display panel 100, taking into consideration all of electron mobility, process deviation and the like. Of course, the example embodiments of the present invention are not limited to the above-described condition, and the semiconductor layer of the TFT can be formed of amorphous silicon, polysilicon or the like, and can include a semiconductor layer that can include other materials or a compound other than an oxide.

Each unit pixel PXL can constituted by several subpixels, such as three subpixels, and each of the subpixels can include red, green and blue subpixels, such as red, green and blue OLEDs, though other colors also can be used.

One of the three subpixels constituting one unit pixel PXL can be designed as a blue subpixel having a hole only device (HOD) structure. But such is not required, and a red or green subpixel can also have the HOD structure. Details of the configuration of the embodiments will be described later.

The timing controller 200 can rearrange digital video data RGB input from an exterior thereof in conformity with a resolution of the display panel 100 and can supply the rearranged digital video data RGB to the data driving circuit 300. In addition, the timing controller 200 can generate a data control signal DDC for control of an operation timing of the data driving circuit 300 and a gate control signal GDC for control of an operation timing of the gate driving circuit 400 based on timing signals such as a vertical synchronization signal Vsync, a horizontal synchronization signal Hsync, a dot clock signal DCLK, a data enable signal DE, etc. Other signals or powers can be generated or used, such as ELVDD, ELVSS and Vinit, among others.

The data driving circuit 300 converts the digital video data RGB input from the timing controller 200 into an analog data voltage based on the data control signal DDC.

The gate driving circuit 400 can generate a scan signal and an emission signal based on the gate control signal GDC. The gate driving circuit 400 can include a scan driver and an emission driver. The scan driver can generate a scan signal in a row-sequential manner in order to drive one or more scan lines connected to each pixel row, and can supply the scan signal to the scan lines. The emission driver can generate an emission signal in a row-sequential manner in order to drive one or more emission lines connected to each pixel row, and can supply the emission signal to the emission lines.

The gate driving circuit 400 as described above can be directly formed or included in the display panel 100 in a gate-driver-in-panel (GIP) manner.

Figure 2:
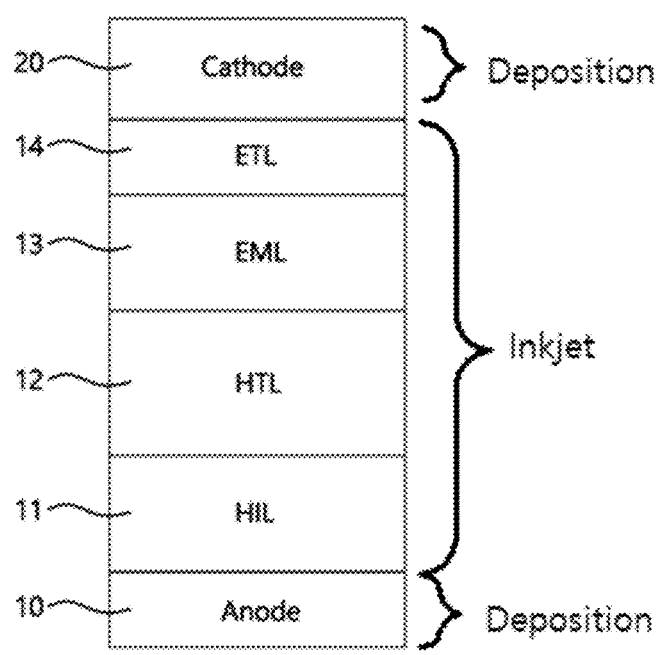
FIG. 2 is a view of a structure of a red or green OLED of an organic light emitting display device according to an example embodiment of the present invention and a process for manufacturing each layer of the structure in accordance with an example embodiment of the present invention.

FIG. 2 is a view of a structure of a red or green OLED of an organic light emitting display device according to an example embodiment of the present invention and a process for manufacturing each layer of the structure in accordance with an example embodiment of the present invention.

As shown in FIG. 2, an OLED disposed at each of red and green subpixels is constituted as a hole injection layer (HIL) 11, a hole transport layer (HTL) 12, an emission material layer (EML) 13, and an electron transfer layer (ETL) 14 are sequentially stacked in this order between a first electrode 10 (for example, an anode) and a second electrode 20 (for example, a cathode).

In the case of the red subpixel, the emission material layer (EML) 13 is formed of a red emission material, whereas, in the case of the green subpixel, the emission material layer (EML) 13 is formed of a green emission material.

All of the hole injection layer (HIL) 11, the hole transport layer (HTL) 12, the emission material layer (EML) 13, and the electron transfer layer (ETL) 14 can be formed by an inkjet printing process. The second electrode 20 can be formed by a deposition process. Meanwhile, each of layers 11, 12, 13 and 14, and the second electrode 20 can be formed using other layer forming processes.

Figure 3:
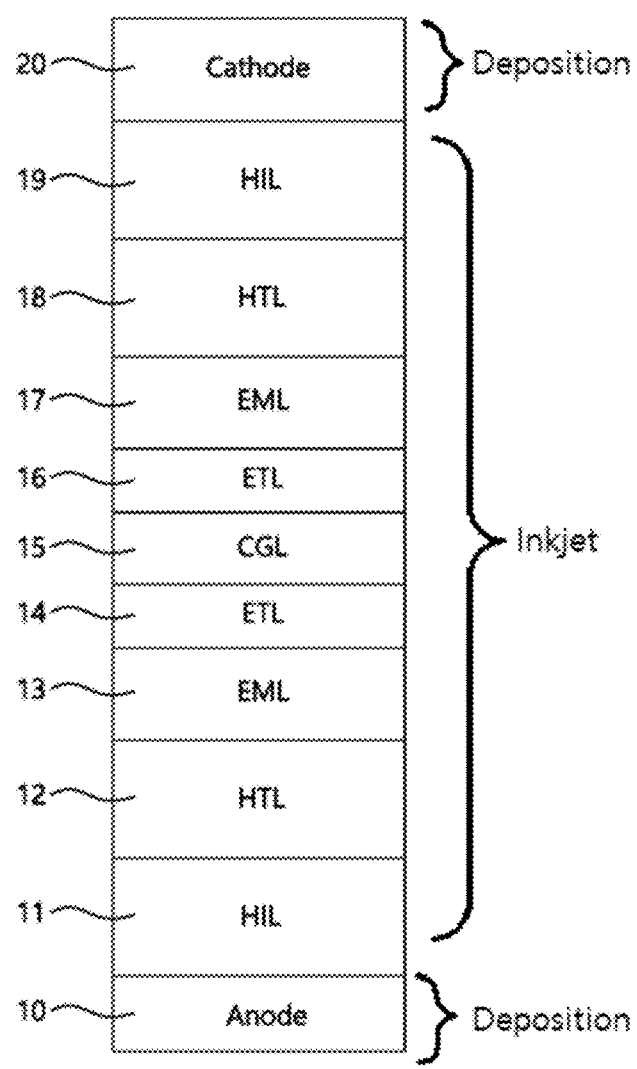
FIG. 3 is a view of a structure of a blue OLED of an organic light emitting display device according to an example embodiment of the present invention and a process for manufacturing each layer of the structure in accordance with an example embodiment of the present invention.

FIG. 3 is a view of a structure of a blue OLED of an organic light emitting display device according to an example embodiment of the present invention and a process for manufacturing each layer of the structure in accordance with an example embodiment of the present invention.

As shown in FIG. 3, an OLED disposed at a blue subpixel can include a first hole injection layer (HIL) 11, a first hole transport layer (HTL) 12, a first emission material layer (EML) 13, a first electron transfer layer (ETL) 14, a charge generation layer (CGL) 15, a second electron transfer layer (ETL) 16, a second emission material layer (EML) 17, a second hole transport layer (HTL) 18, and a second hole injection layer (HIL) 19, and which are sequentially stacked in this order between a first electrode 10 (for example, an anode) and a second electrode 20 (for example, a cathode).

Both the first and second emission material layers 13 and 17 are formed of a blue emission material.

The first electrode 10 can include an ITO/Ag/ITO structure, and the second electrode 20 can include Ag.

All of the first hole injection layer (HIL) 11, the first hole transport layer (HTL) 12, the first emission material layer (EML) 13, the first electron transfer layer (ETL) 14, the charge generation layer (CGL) 15, the second electron transfer layer (ETL) 16, the second emission material layer (EML) 17, the second hole transport layer (HTL) 18, and the second hole injection layer (HIL) 19 can be formed by an inkjet printing process. The second electrode 20 can be formed by a deposition process. In embodiments of the present invention, the first emission material layer (EML) 13 can be included in a first organic light emitting element, and the second emission material layer (EML) 17 can be include in a second organic light emitting elements.

A method for forming OLEDs of red, green and blue subpixels by an inkjet printing process will be briefly described.

FIGS. 4A to 4D are cross-sectional views of a process for manufacturing an OLED of each subpixel in accordance with an example embodiment of the present invention.

Figure 4A:
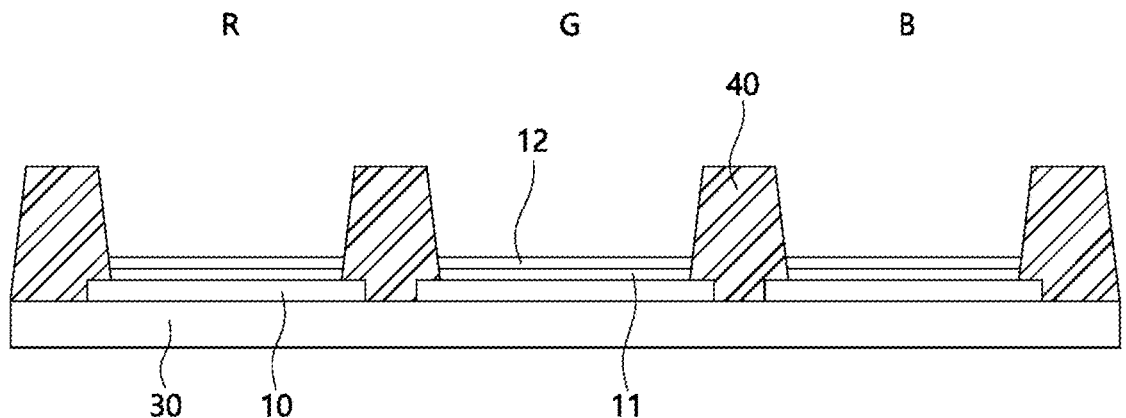
FIGS. 4A to 4D are cross-sectional views of a process for manufacturing an OLED of each subpixel in accordance with an example embodiment of the present invention.

As shown in FIG. 4A, first electrodes 10 are respectively formed in red, green and blue subpixel regions R, G and B on a substrate 30 including the red, green and blue subpixel regions R, G and B. The first electrodes 10 can be formed of a transparent conductive material such as ITO, IZO, or the like. Compounds other than an oxide can be used.

In addition, a bank layer 40 having the form of a lattice can be formed in boundary portions of the subpixel regions R, G and B such that the bank layer 40 overlaps with edge portions of the first electrodes 10 by coating a hydrophobic material on the substrate 30 formed with the first electrodes 10, and selectively removing the hydrophobic material.

The bank layer 40 can be formed of an organic material or an inorganic material.

Figure 4B:
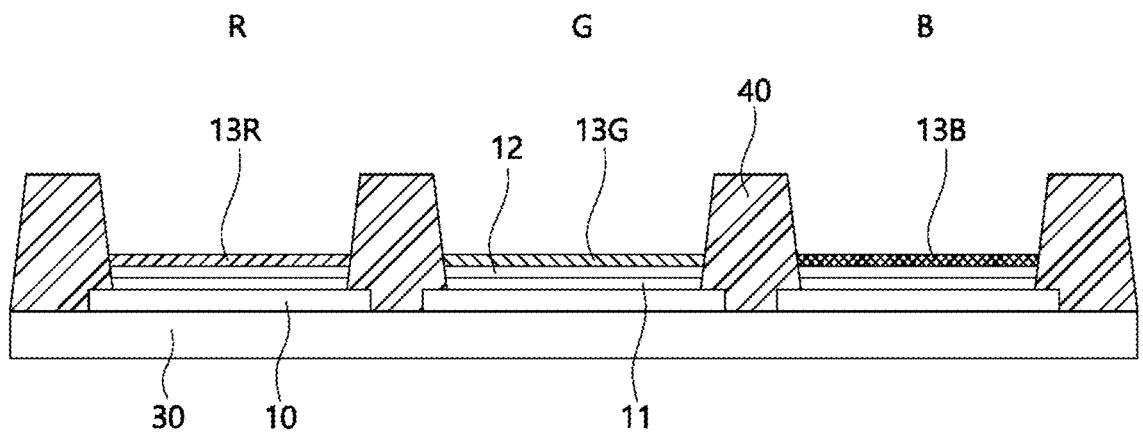

As shown in FIG. 4B, a hole injection material solution can be dropped onto the first electrodes 10 of the red subpixel region R, the green subpixel region G and the blue subpixel region B using an inkjet printing process, for example. A drying process is then performed, thereby forming a hole injection layer (HIL) 11 on the first electrodes 10.

The hole injection layer (HIL) 11 can be formed of a conductive polymer (PEDOT: PSS) with an aromatic structure including thiophene, sulfonate or the like or an aromatic amine-based material including an alkyl group, an alkoxy group or the like. Meanwhile, the hole injection layer (HIL) 11 can include other materials or can be formed using other materials.

When the hole injection material solution is dropped, the hole injection layer 11 need not be formed at an upper surface of the bank layer 40 because the bank layer 40 has hydrophobicity.

A solvent of the hole injection material solution is evaporated by the drying process and, as such, only a solute of the hole injection material solution remains.

A hole transport material solution is dropped onto the hole injection layer 11 in the red subpixel region R, the green subpixel region G and the blue subpixel region B, and is then dried, thereby forming a hole transport layer (HTL) 12 on the hole injection layer (HIL) 11.

The hole transport layer 12 can be formed of an amine-based material including an aromatic ring, such as carbazole, naphthalene, fluorene or the like. For example, the hole transport layer 12 can be formed of a material such as 4,4'-Bis (N-carbazolyl)-1,1'-biphenyl (CBP), N, N'-di(1-naphthyl)-N, N'-diphenyl-(1,1'-biphenyl)-4,4'-diamine) (NPD), tris(4-carbazoyl-9-ylphenyl) amine (TCTA), or the like. Meanwhile, the hole transport layer (HTL) 12 can include other materials or can be formed using other materials.

A red emission material solution, a green emission material solution and a blue emission material solution are dropped in the red subpixel region R, the green subpixel region G and the blue subpixel region B, respectively.

Thereafter, the dropped red emission material solution, the dropped green emission material solution and the dropped blue emission material solution are dried.

Accordingly, a red emission material layer 13R, a green emission material layer 13G and a blue emission material layer 13B are formed on the hole transport layer (HTL) 12 in the red subpixel region R, the green subpixel region G and the blue subpixel region B, respectively.

The red emission material layer 13R can be formed of a material with an aromatic structure including carbazole, fluorene, imidazole, naphthalene or the like. Other materials can be used.

The green emission material layer 13G can be formed of a material with an aromatic structure including carbazole, fluorene, or the like. Other materials can be used.

The blue emission material layer 13B can be formed of a material with an aromatic structure including distyryl arylene, anthracene, pyrene, or the like. Other materials can be used.

Figure 4C:
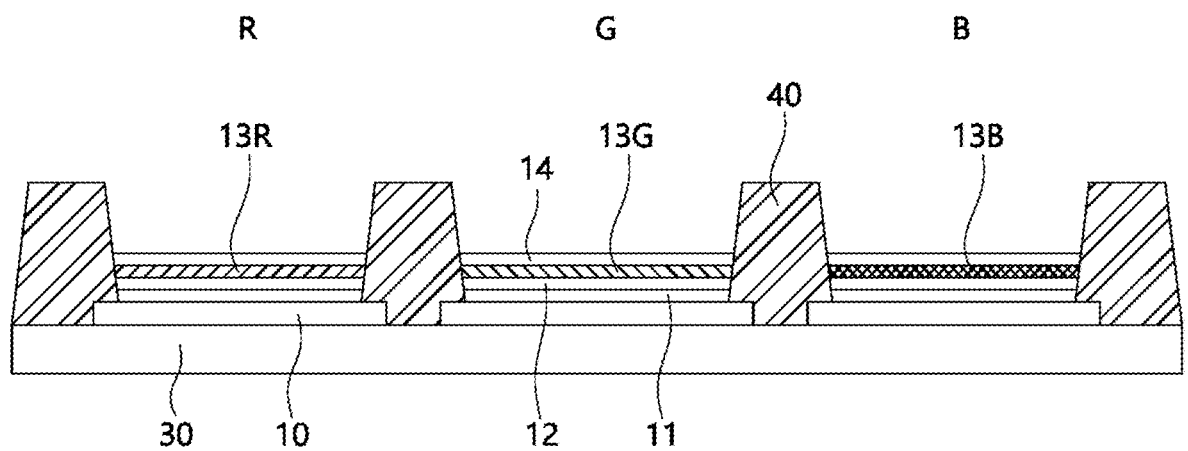

As shown in FIG. 4C, an electron transfer material solution is dropped in the red subpixel region R, the green subpixel region G and the blue subpixel region B respectively formed with the emission material layers 13R, 13G and 13B, and is then dried, thereby forming an electron transfer layer (ETL) 14 on each of the emission material layers 13R, 13G and 13B.

The electron transfer layer (ETL) 14 can be formed of a material with an aromatic structure including pyridine, triazine, oxadiazole, triazole, or the like. For example, the electron transfer layer (ETL) 14 can be formed of 1,3-bis [2-(4-tert-butylphenyl)-1,3,4-oxadiazo-5-yl]benzene) (OXD), bathophenanthroline (Bphen), or the like. Other materials can be used.

Figure 4D:
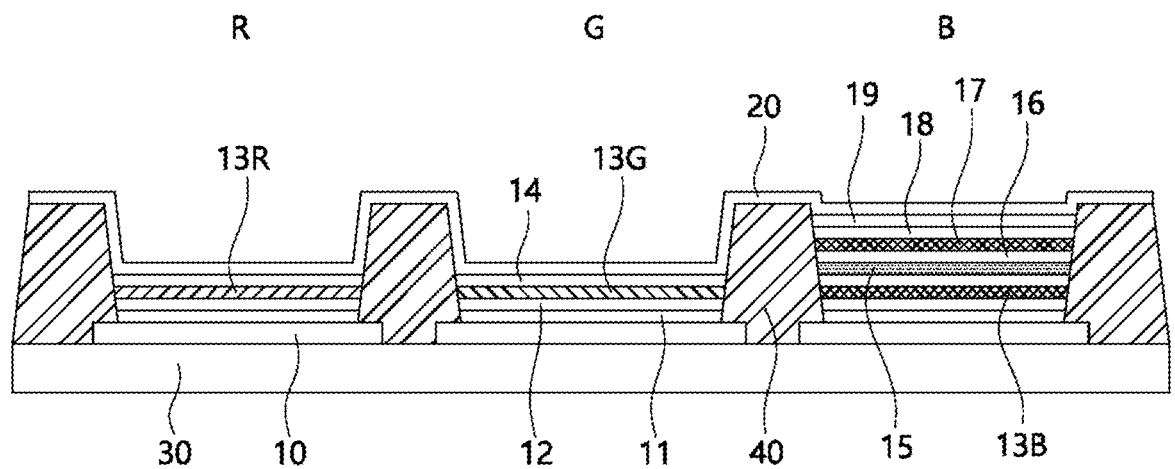

As shown in FIG. 4D, a charge generation layer (CGL) 15, a second electron transfer layer (ETL) 16, a second emission material layer (EML) 17, a second hole transport layer (HTL) 18, and a second hole injection layer (HIL) 19 can be sequentially formed in this order in only the blue subpixel region B from among the red subpixel region R, the green subpixel region G and the blue subpixel region B by performing processes of dropping and drying desired material solutions, as described above.

In addition, a second electrode 20 can be formed using a deposition process, to extend on and along an upper portion of the bank layer 40, the electron transfer layer (ETL) 14 and the second hole injection layer (HIL) 19.

The charge generation layer (CGL) 15 can be formed of a conductive polymer (PEDOT: PSS) with an aromatic structure including thiophene, sulfonate or the like or an aromatic amine-based material including an alkyl group, an alkoxy group or the like. Other materials can be used.

Meanwhile, two blue OLEDs formed in the blue subpixel region B can be formed to have an HOD structure.

Hereinafter, an operation principle of the two blue OLEDs will be described.

Figure 5:
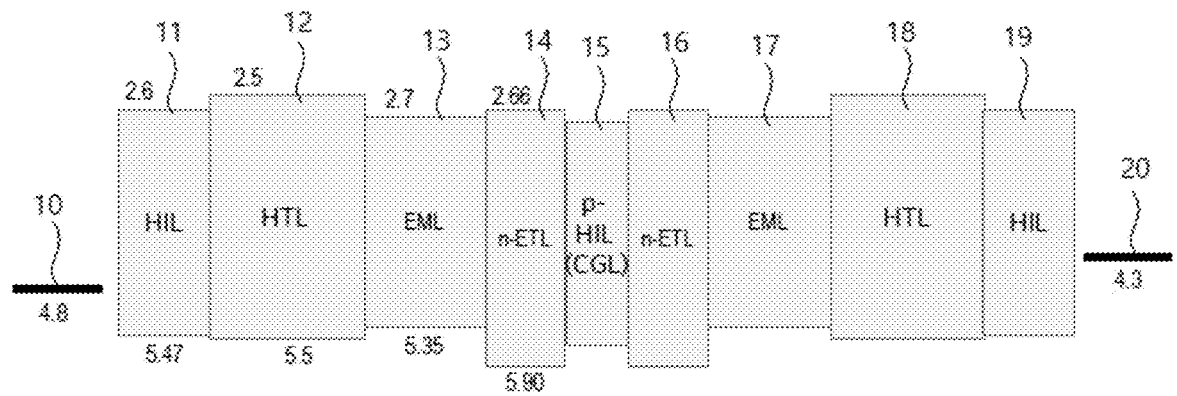
FIG. 5 is an energy level diagram explaining an operation principle of an HOD structure of FIG. 3.

FIG. 5 is an energy level diagram explaining an operation principle of an HOD structure of FIG. 3.

As shown in FIGS. 3 and 5, the two blue OLEDs are configured to have a structure in which the first and second blue emission material layers 13 and 17 are symmetrical with each other with reference to the charge generation layer (CGL) 15.

Accordingly, when a positive (+) voltage is applied to the first electrode 10, and a negative (−) voltage is applied to the second electrode 20 (forward bias), holes and electrons are generated at an interface between the charge generation layer (CGL) 15 and each of the first electron transfer layer (ETL) 14 and the second electron transfer layer (ETL) 16 adjacent to the first electron transfer layer (ETL) 15. The holes and electrons are generated at the interface between the charge generation layer (CGL) 15 and each of the first electron transfer layer (ETL) 14 and the second electron transfer layer (ETL) 16 adjacent to the first electron transfer layer (ETL) 15 by the forward bias drift due to the applied voltages.

Holes transitioned from the first electrode 10 move to the first blue emission material layer (EML) 13, and electrons generated at the interface between the charge generation layer (CGL) 15 and each of the first electron transfer layer (ETL) 14 and the second electron transfer layer (ETL) 16 adjacent to the first electron transfer layer (ETL) 15 can also move to the first blue emission material layer (EML) 13, thereby forming excitons. As a result, the first blue emission material layer (EML) 13 generates visible light.

In this case, electrons transitioned from the second electrode 20 cannot move to the second blue emission material layer (EML) 17 because energy barriers of the second hole transport layer (HTL) 18 and the second hole injection layer (HIL) 19 are high. As a result, the second blue emission material layer (EML) 17 cannot emit light.

Conversely, when a negative (−) voltage is applied to the first electrode 10, and a positive (+) voltage is applied to the second electrode 20 (reverse bias), holes and electrons are generated at the interface between the charge generation layer (CGL) 15 and each of the first electron transfer layer (ETL) 14 and the second electron transfer layer (ETL) 16 adjacent to the charge generation layer (CGL) 15.

The holes and electrons are generated at the interface between the charge generation layer (CGL) 15 and each of the first electron transfer layer (ETL) 14 and the second electron transfer layer (ETL) 16 adjacent to the charge generation layer (CGL) 15 by the reverse bias drift due to the applied voltages.

Holes transitioned from the second electrode 20 move to the second blue emission material layer (EML) 17, and electrons generated at the interface between the charge generation layer (CGL) 15 and each of the first electron transfer layer (ETL) 14 and the second electron transfer layer (ETL) 16 adjacent to the charge generation layer (CGL) 15 can also move to the second blue emission material layer (EML) 17, thereby forming excitons. As a result, the second blue emission material layer (EML) 17 generates visible light.

In this case, electrons transitioned from the first electrode 10 cannot move to the first blue emission material layer (EML) 13 because energy barriers of the first hole transport layer (HTL) 11 and the first hole injection layer (HIL) 12 are high. As a result, the first blue emission material layer (EML) 13 cannot emit light.

Since the above-described structure only uses hole current in principle, this structure is referred to as a "hole only device (HOD)" structure.

In accordance with the above-described principle, as shown in FIG. 3, when a forward bias is applied to a blue OLED having the above-described HOD structure, the first blue emission material layer 13 of the HOD structure emits light, whereas, when a reverse bias is applied to the blue OLED, the second blue emission material layer 17 of the HOD structure emits light.

In accordance with the example embodiment of the present invention, it can be possible to achieve an enhancement in emission characteristics of the organic light emitting display device using the above-described structure.

Figure 6:
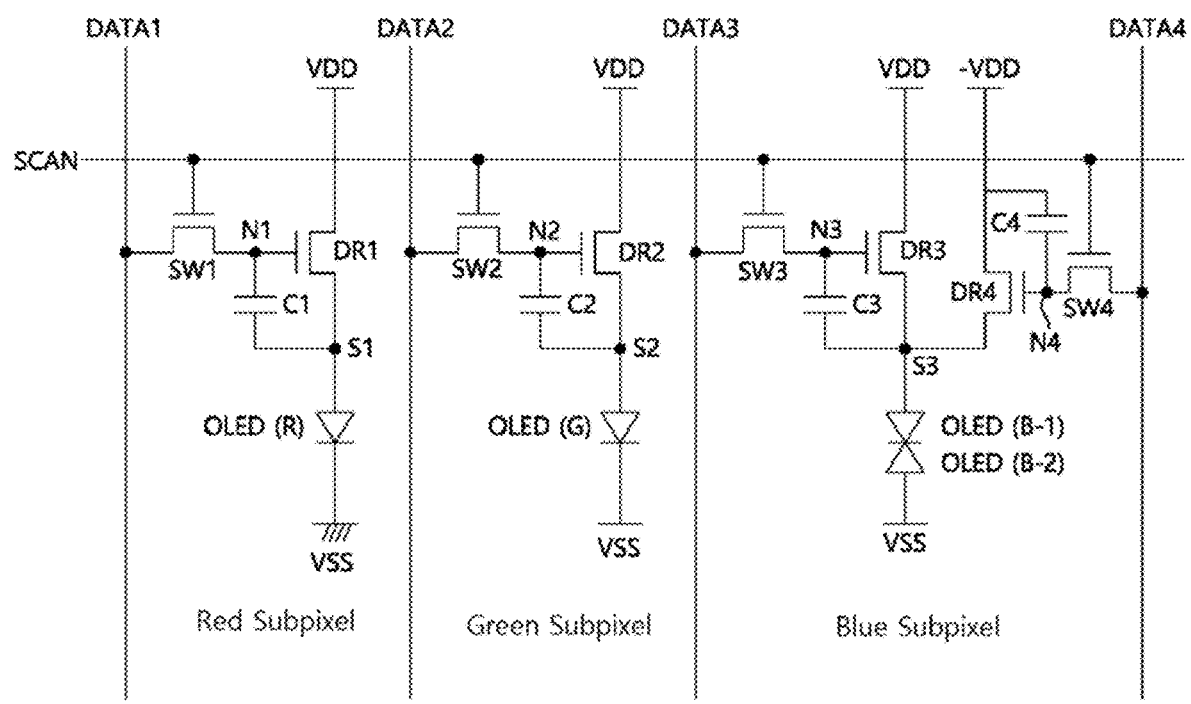
FIG. 6 is a circuit diagram of a circuit configuration of one unit pixel of an organic light emitting display panel according to an example embodiment of the present invention.

FIG. 6 is a circuit diagram of a circuit configuration of one unit pixel of an organic light emitting display panel according to an example embodiment of the present invention. The unit pixel according to the example embodiment of the present invention is shown as being constituted by a red OLED OLED (R), a green OLED OLED (G), and first and second blue OLEDs OLED (B-1) and OLED (B-2).

The first and second blue OLEDs OLED (B-1) and OLED (B-2) are shown as being reversely connected to each other in that first and second emission material layers 13 and 17 are configured to be symmetrical with each other with reference to a charge generation layer (CGL) 15.

As shown in FIG. 6, the unit pixel is driven by one scan line SCAN and four data lines DATA1, DATA2, DATA3 and DATA4.

A red subpixel and a green subpixel each is driven by one data line, that is, a corresponding one of the data lines DATA1 and DATA2, whereas a blue subpixel is driven by two data lines, that is, the data lines DATA3 and DATA4, and two high-level voltage supply lines VDD and −VDD. In embodiments of the present invention, the voltage supplied by the two high-level voltage supply lines VDD and −VDD can be the same, but such is not required, so that either the high-level voltage supply line VDD can have a higher voltage level that the high-level voltage supply line-VDD, or vice versa.

Next, a configuration of a pixel circuit configured to selectively drive the OLEDs, including OLED (R), OLED (G), and OLED (B-1) and OLED (B-2) configured as described above will be described.

The driving circuit configured to drive the red OLED OLED (R), the green OLED OLED (G) and the first and second blue OLEDS OLED (B-1) and OLED (B-2) of the unit pixel includes first to fourth switching transistors SW1 to SW4, first to fourth driving transistors DR1 to DR4, and first to fourth capacitors C1 to C4, as shown in FIG. 6, respectively. In other embodiments of the present invention, a color relating to the first and second emission material layers 13 and 17 need not be only blue color, but can also include red and green colors. Meanwhile, in FIG. 6, although the first and second blue OLEDs OLED (B-1) and OLED (B-2) are provided for the blue OLEDs, in other embodiments, the first and second emission material layers 13 and 17 can be different colors from each other, so that a subpixel can emit a plurality of different colors individually. That is, the first and second emission material layers 13 and 17 can emit different colors, but at different times.

In the case of the first switching transistor SW1, a gate electrode thereof is connected to the scan line SCAN, a first electrode thereof is connected to the first data line DATA1, and a second electrode thereof is connected to a node N1 and, as such, is controlled by a scan pulse of the scan line SCAN, to transmit a data voltage of the first data line DATA1 to the node N1.

In the case of the second switching transistor SW2, a gate electrode thereof is connected to the scan line SCAN, a first electrode thereof is connected to the second data line DATA2, and a second electrode thereof is connected to a node N2 and, as such, is controlled by the scan pulse of the scan line SCAN, to transmit a data voltage of the second data line DATA2 to the node N2.

In the case of the third switching transistor SW3, a gate electrode thereof is connected to the scan line SCAN, a first electrode thereof is connected to the third data line DATA3, and a second electrode thereof is connected to a node N3 and, as such, is controlled by the scan pulse of the scan line SCAN, to transmit a data voltage of the third data line DATA3 to the node N3.

In the case of the fourth switching transistor SW4, a gate electrode thereof is connected to the scan line SCAN, a first electrode thereof is connected to the fourth data line DATA4, and a second electrode thereof is connected to a node N4 and, as such, is controlled by the scan pulse of the scan line SCAN, to transmit a data voltage of the fourth data line DATA4 to the node N4.

In the case of the first driving transistor DR1, a gate electrode thereof is connected to the node N1, a first electrode thereof is connected to the high-level voltage supply line VDD, and a second electrode thereof is connected to a node S1 and, as such, controls current flowing through the red OLED OLED (R) in accordance with a voltage of the node N1.

In the case of the second driving transistor DR2, a gate electrode thereof is connected to the node N2, a first electrode thereof is connected to the high-level voltage supply line VDD, and a second electrode thereof is connected to a node S2 and, as such, controls current flowing through the green OLED OLED (G) in accordance with a voltage of the node N2.

In the case of the third driving transistor DR3, a gate electrode thereof is connected to the node N3, a first electrode thereof is connected to the high-level voltage supply line VDD, and a second electrode thereof is connected to a node S3 and, as such, controls current flowing through the blue OLED OLED (B-1) in accordance with a voltage of the node N3.

In the case of the fourth driving transistor DR4, a gate electrode thereof is connected to the node N4, a first electrode thereof is connected to the high-level voltage supply line-VDD, and a second electrode thereof is connected to the node S3 and, as such, controls current flowing through the blue OLED OLED (B-2) in accordance with a voltage of the node N4.

The first capacitor C1 is connected between the node N1 and the node S1 and, as such, stores a data voltage supplied to the node N1 for one frame.

The second capacitor C2 is connected between the node N2 and the node S2 and, as such, stores a data voltage supplied to the node N2 for one frame.

The third capacitor C3 is connected between the node N3 and the node S3 and, as such, stores a data voltage supplied to the node N3 for one frame.

The fourth capacitor C4 is connected between the node N4 and the high-level voltage supply line-VDD and, as such, stores a data voltage supplied to the node N4 for one frame.

In this case, the red OLED OLED (R) is connected between the node S1 and a low-level voltage supply line VSS, and the green OLED OLED (G) is connected between the node S2 and the low-level voltage supply line VSS.

The first and second blue OLEDs OLED (B-1) and OLED (B-2) reversely connected to each other are connected between the node S3 and the low-level voltage supply line VSS.

In addition, a data voltage can be alternately applied to the third and fourth data lines DATA3 and DATA4 on a frame basis.

Hereinafter, details of the structure of the unit pixel having the above-described circuit configuration according to an example embodiment of the present invention will be described.

Figure 7:
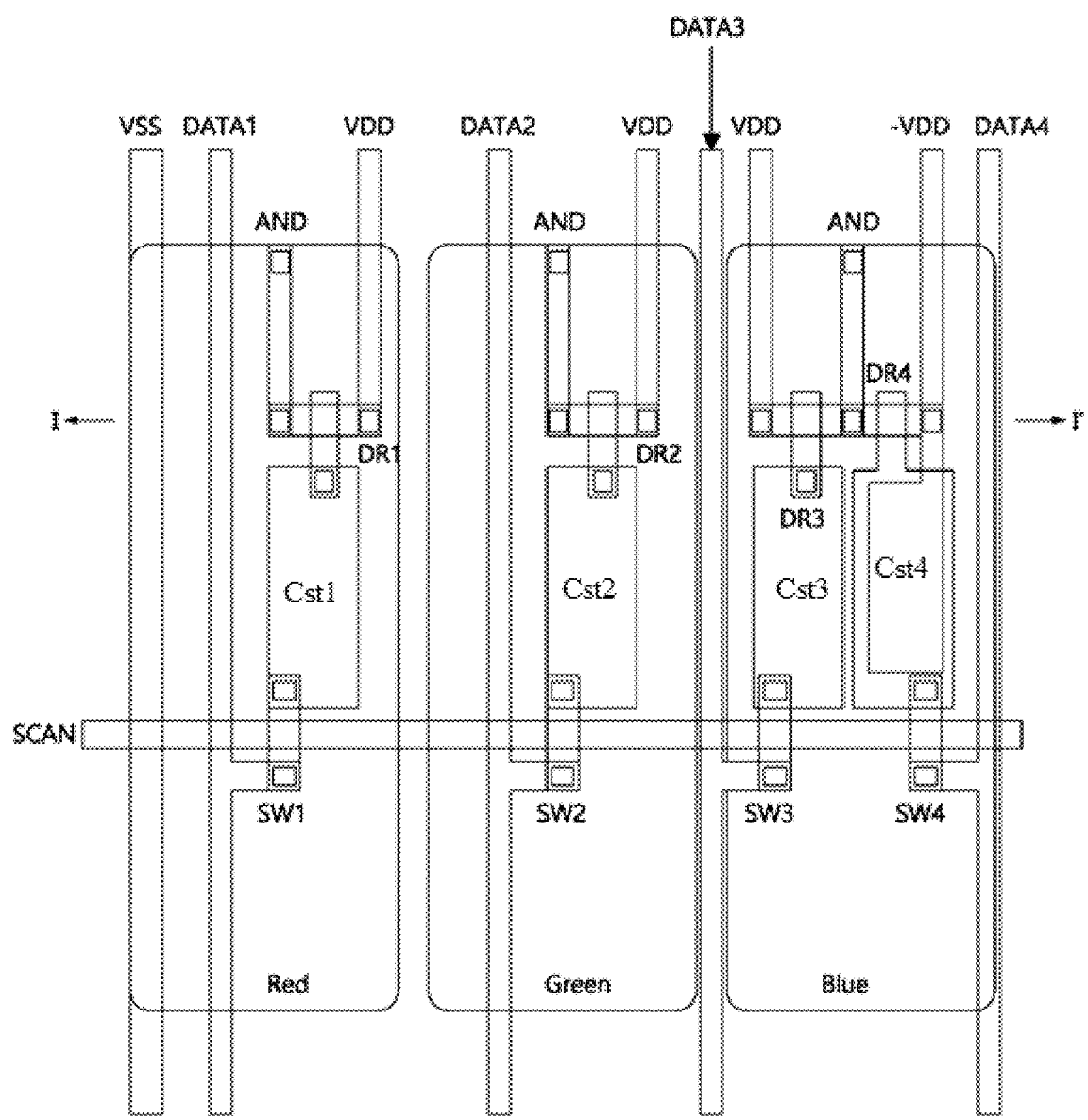
FIG. 7 is a layout view of a configuration of one unit pixel of an organic light emitting display device according to an example embodiment of the present invention.
Figure 8:
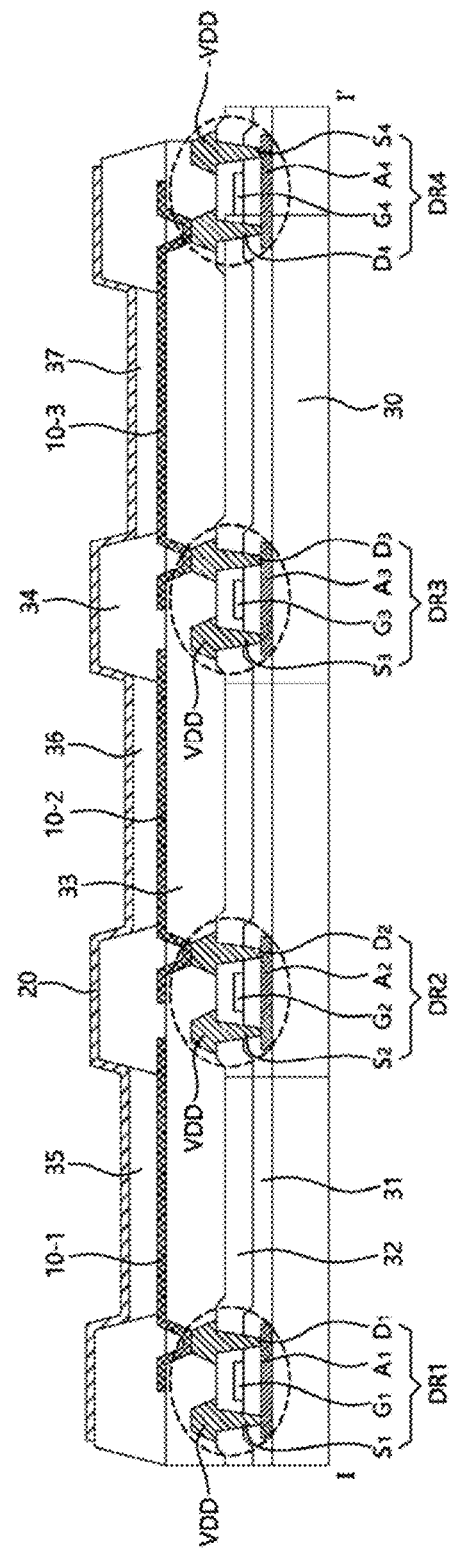
FIG. 8 is a cross-sectional view taken along line I-I' in FIG. 7.

FIG. 7 is a layout view of a configuration of one unit pixel of an organic light emitting display device according to an example embodiment of the present invention. FIG. 8 is a cross-sectional view taken along line I-I' in FIG. 7.

As shown in FIGS. 7 and 8, the unit pixel is driven by one scan line SCAN and four data lines DATA1, DATA2, DATA3 and DATA4, and a blue subpixel thereof is driven by two data lines, that is, the data lines DATA3 and DATA4, and two high-level voltage supply lines VDD and −VDD.

A red subpixel is driven by one switching transistor SW1 and one driving transistor DR1, a green subpixel is driven by one switching transistor SW2 and one driving transistor DR2, and the blue subpixel is driven by two switching transistors SW3 and SW4 and two driving transistors DR3 and DR4.

As shown in FIG. 8, in the unit pixel, first to fourth active layers A1, A2, A3 and A4 are independently formed on a substrate 30, and a gate insulating layer 31 is formed on the entire surface of the substrate 30 including the first to fourth active layers A1, A2, A3 and A4.

First to fourth gate electrodes G1, G2, G3 and G4 are independently formed on the gate insulating layer 31, to overlap with the first to fourth active layers A1, A2, A3 and A4, respectively. An interlayer insulating layer 32 is formed on the gate insulating layer 31 including the first to fourth gate electrodes G1, G2, G3 and G4.

A plurality of contact holes is formed in the gate insulating layer 31 and the interlayer insulating layer 32 to expose both ends of the first to fourth active layers A1, A2, A3 and A4. First source/drain electrodes S1/D1, second source/drain electrodes S2/D2, third source/drain electrodes S3/D3 and fourth source/drain electrodes S4/D4 are formed on the interlayer insulating layer 32 at both ends of the first to fourth active layers A1, A2, A3 and A4, respectively, such that the source/drain electrodes corresponding to each active layer are electrically interconnected.

In this case, the gate electrode G1, the active layer A1, the source electrode S1 and the drain electrode D1 constitute the first driving transistor DR1 shown in FIGS. 6 and 7.

The gate electrode G2, the active layer A2, the source electrode S2 and the drain electrode D2 constitute the second driving transistor DR2 shown in FIGS. 6 and 7.

The gate electrode G3, the active layer A3, the source electrode S3 and the drain electrode D3 constitute the third driving transistor DR3 shown in FIGS. 6 and 7.

The gate electrode G4, the active layer A4, the source electrode S4 and the drain electrode D4 constitute the fourth driving transistor DR4 shown in FIGS. 6 and 7.

A planarization layer 33 is formed on the interlayer insulating layer 32 including the first source/drain electrodes S1/D1, the second source/drain electrodes S2/D2, the third source/drain electrodes S3/D3 and the fourth source/drain electrodes S4/D4. First to fourth contact holes are formed at the planarization layer 33, to expose the first to fourth drain electrodes D1, D2, D3 and D4. Three first electrodes 10-1, 10-2 and 10-3 are formed in red, green and blue emission regions, respectively, to be electrically connected to the first to fourth drain electrodes D1, D2, D3 and D4 via the first to fourth contact holes. The first electrode 10-3 is electrically connected to the third and fourth drain electrodes D3 and D4 via the third and fourth contact holes.

A bank layer 34 is formed in a boundary portion of each emission region, to overlap with edge portions of the three first electrodes 10-1, 10-2 and 10-3, and a red emission material layer 35, a red emission material layer 36 and a blue emission material layer 37 are formed over the three first electrodes 10-1, 10-2 and 10-3, respectively.

The red emission material layer 35 and the green emission material 36 are formed to have the structure as shown in FIG. 2, and the blue emission material layer 37 is formed to have the structure as shown in FIG. 3.

In FIG. 8, the source electrode S1 of the first driving transistor DR1 and the source electrode S2 of the second driving transistor DR2 can be electrically connected to the high-voltage supply line VDD, as shown in FIGS. 6 and 7.

The source electrode S3 of the third driving transistor DR3 can be electrically connected to the high-level voltage supply line VDD, and the source electrode S4 of the fourth driving transistor DR4 can be electrically connected to the high-level voltage supply line-VDD.

Hereinafter, operation of the unit pixel of the organic light emitting display device according to the example embodiment of the present invention configured as described above will be described.

In the unit pixel circuit of FIG. 6, when a scan pulse is provided to the scan line SCAN, and a data signal is supplied to the first to third data lines DATA1, DATA2 and DATA3, during a first frame, the red OLED OLED (R) of the red subpixel, the green OLED OLED (G) of the green subpixel, and the first blue OLED OLED (B-1) of the blue subpixel emit light, thereby displaying an image.

When a scan pulse is provided to the scan line SCAN, and a data signal is supplied to the first, second and fourth data lines DATA1, DATA2 and DATA4, during a second frame, the red OLED OLED (R) of the red subpixel, the green OLED OLED (G) of the green subpixel, and the second blue OLED OLED (B-2) of the blue subpixel emit light, thereby displaying an image.

Since the first blue OLED OLED (B-1) and the second blue OLED OLED (B-2) of the blue subpixel are alternately driven on a frame basis, it can be possible to double the lifespan of the blue subpixel.

In the above-described organic light emitting display device according to the example embodiment of the present invention, the blue subpixel is formed to have an HOD structure in which the first and second blue emission material layers 13 and 17 are symmetrical with each other with reference to the charge generation layer (CGL) 15, and is driven by two driving transistors such that one of the first and second blue emission material layers 13 and 17 emits light in accordance with polarities of voltages applied to the first electrode 10 and the second electrode 20.

Accordingly, the first blue OLED OLED (B-1) and the second blue OLED OLED (B-2) of the blue subpixel are alternately driven on a frame basis and, as such, it can be possible to double the lifespan of the blue subpixel.

In addition, even when the blue subpixel has the same size as the red subpixel or the green subpixel, blue emission characteristics can be enhanced.

The foregoing description and the accompanying drawings have been presented in order to illustratively explain technical ideas of the present invention. A person skilled in the art to which the present invention pertains can appreciate that diverse modifications and variations obtained by combining, dividing, substituting, or changing constituent elements can be possible without changing essential characteristics of the present invention. Therefore, the foregoing embodiments disclosed herein shall be interpreted as illustrative only and not as limitative of the principle and scope of the present invention. It should be understood that the scope of the present invention shall be defined by the appended claims and all of their equivalents fall within the scope of the present invention.

What is claimed is:

1. An organic light emitting display device comprising:
    a display panel comprising a plurality of data lines and a plurality of scan lines intersecting each other with unit pixels arranged in a matrix format, each of the unit pixels being disposed in a region of the display panel where one scan line intersects four data lines;
    a data driving circuit configured to drive the plurality of data lines; and
    a gate driving circuit configured to drive the plurality of scan lines,
    wherein each of the unit pixels comprises at least three subpixels,
    wherein one subpixel of the at least three subpixels in each of the un it pixels comprises two emission material layers stacked to form a hole only device (HOD) structure,
    wherein the one subpixel is driven by two data lines,
    wherein the one subpixel further includes at least two electron transfer layers interposed between a first emission material layer and a second emission material layer of the two emission layers, and
    wherein the one subpixel further comprises:
        a first electrode and a second electrode; and
        a first hole injection layer, a first hole transport layer, the first emission material layer of the two emission material layers, a first electron transfer layer of the at least two electron transfer layer, a charge generation layer, a second electron transfer layer of the at least two electron transfer layer, the second emission material layer of the two emission material layers, a second hole transport layer, and a second hole injection layer that are sequentially stacked in this order between the first electrode and the second electrode.

2. The organic light emitting display device according to claim 1, wherein the one subpixel is driven by two driving transistors.

3. The organic light emitting display device according to claim 1, wherein each of the first and second emission material layers comprises a blue emission material layer.

4. The organic light emitting display device according to claim 3, wherein the blue emission material layer includes a material with an aromatic structure comprising at least one of distyryl arylene, anthracene, and pyrene.

5. The organic light emitting display device according to claim 1, wherein:
    only the first emission material layer emits light when a positive (+) voltage is applied to the first electrode and a negative (−) voltage is applied to the second electrode to generate a forward bias; and
    only the second emission material layer emits light when the negative (−) voltage is applied to the first electrode and the positive (+) voltage is applied to the second electrode to generate a reverse bias.

6. The organic light emitting display device according to claim 1, wherein the first hole injection layer, the first hole transport layer, the first emission material layer, the first electron transfer layer, the charge generation layer, the second electron transfer layer, the second emission material layer, the second hole transport layer, and the second hole injection layer are formed by an inkjet printing process.

7. The organic light emitting display device according to claim 1, wherein the first hole injection layer and the second hole injection layer include a conductive polymer with an aromatic structure comprising at least one of thiophene and sulfonate, or an aromatic amine-based material comprising at least one of an alkyl group and an alkoxy group.

8. The organic light emitting display device according to claim 1, wherein the first hole transport layer and the second hole transport layer include an amine-based material with an aromatic ring comprising at least one of carbazole, naphthalene, and fluorene.

9. The organic light emitting display device according to claim 1, wherein the first electron transfer layer and the second electron transfer layer include a material with an aromatic structure comprising at least one of pyridine, triazine, oxadiazole, and triazole.

10. The organic light emitting display device according to claim 1, wherein the charge generation layer includes a conductive polymer with an aromatic structure comprising at least one of thiophene, and sulfonate, or an aromatic amine-based material comprising at least one of an alkyl group, and an alkoxy group.

11. The organic light emitting display device according to claim 1, wherein:
    the one subpixel is driven by one scan line from among the plurality of scan lines, and a first data line and a second data line from among the plurality of data lines;
    the one subpixel comprises:
        a first switching transistor comprising a gate electrode connected to the one scan line, a first electrode connected to the first data line and a second electrode connected to a first node, the first switching transistor being controlled by a scan pulse of the one scan line to transmit a data voltage of the first data line to the first node;
        a first driving transistor comprising a gate electrode connected to the first node, a first electrode connected to a first high-level voltage supply line and a second electrode connected to a second node, the first driving transistor controlling current flowing through a first organic light emitting element in accordance with a voltage of the first node, the first organic light emitting element including a first emission material layer of the two emission material layers;

a first capacitor connected between the first node and the second node, and to store a data voltage supplied to the first node for one frame;

a second switching transistor comprising a gate electrode connected to the scan line, a first electrode connected to the second data line and a second electrode connected to a third node, the second switching transistor being controlled by the scan pulse of the scan line to transmit a data voltage of the second data line to the third node;

a second driving transistor comprising a gate electrode connected to the third node, a first electrode connected to a second high-level voltage supply line and a second electrode connected to the second node, the second driving transistor controlling current flowing through a second organic light emitting element in accordance with a voltage of the third node, the second organic light emitting element including a second emission material layer of the two emission material layers; and a second capacitor connected between the third node and the second high-voltage supply line, and to store a data voltage supplied to the third node for one frame; and the first organic light emitting element and the second organic light emitting element are reversely connected to each other between the second node and a low-level voltage supply line.

12. The organic light emitting display device according to claim 11, wherein the data driving circuit alternately applies a data voltage to the first data line and the second data line on a frame basis.

13. The organic light emitting display device according to claim 11, wherein the first high-level voltage supply line applies a positive (+) high-level voltage, and the second high-level voltage supply line supplies a negative (−) high-level voltage.

14. The organic light emitting display device according to claim 11, wherein each of the first light emitting element and the second organic light emitting element comprises a blue light emitting diode.

15. The organic light emitting display device according to claim 1, wherein the two emission material layers of the one subpixel are stacked symmetrically with each other with reference to a charge generation layer interposed between the two emission material layers.

16. The organic light emitting display device according to claim 15, wherein the one subpixel is a blue subpixel, and the remaining two of the at least three subpixels are a red subpixel and a green subpixel, and wherein the blue subpixel has a same size as that of the red subpixel or the green subpixel.

17. An organic light emitting display device comprising:

a display panel including a plurality of unit pixels arranged in a matrix configuration, wherein each unit pixel of the plurality unit pixels comprises at least three subpixels, wherein one subpixel of the at least three subpixels includes a first emission material layer and a second emission material layer stacked on each other, and each of the first and second emission material layers is configured to emit light having a color, wherein:

when the first emission material layer is emitting light, the second emission material layer does not emit light, and when the second emission material layer is emitting light, the first emission material layer does not emit light, wherein the one subpixel further includes at least two electron transfer layers interposed between the first emission material layer and the second emission material layer, and wherein a charge generation layer (CGL) is directly connected to a first electron transfer layer (ETL) and a second electron transfer layer (ETL) of the at least two electron transfer layers.

18. The organic light emitting display device according to claim 17, further comprising:

a plurality of data lines and a plurality of scan lines intersecting each other, wherein the each unit pixel is disposed in a region of the display panel where one scan line intersects four data lines;

a data driving circuit configured to drive the plurality of data lines; and a gate driving circuit configured to drive the plurality of scan lines, wherein two of the four data lines are connected to the one subpixel of the at least three subpixels.

19. The organic light emitting display device according to claim 17, wherein the charge generation layer is interposed between the at least two electron transfer layers.

* * * * *